United States Patent [19]

Geissler et al.

[11] 4,438,189

[45] Mar. 20, 1984

[54] RADIATION-POLYMERIZABLE MIXTURE AND PHOTOPOLYMERIZABLE COPYING MATERIAL PREPARED THEREFROM

[75] Inventors: Ulrich Geissler, Frankfurt; Walter Herwig, Bad Soden, both of Fed. Rep. of Germany

[73] Assignee: Hoechst Aktiengesellschaft, Frankfurt am Main, Fed. Rep. of Germany

[21] Appl. No.: 407,488

[22] Filed: Aug. 12, 1982

[30] Foreign Application Priority Data

Aug. 28, 1981 [DE] Fed. Rep. of Germany ....... 3134123

[51] Int. Cl.$^3$ .............................................. G03C 1/68
[52] U.S. Cl. ................................... 430/280; 430/281; 430/284; 430/285; 430/286; 430/288; 430/292; 430/300; 430/308; 430/330; 430/523; 430/905; 430/913
[58] Field of Search ............... 430/288, 280, 284, 292, 430/300, 308, 330, 281, 523, 905, 913, 285

[56] References Cited

U.S. PATENT DOCUMENTS

| | | | |
|---|---|---|---|
| 3,776,729 | 12/1973 | Levy et al. ............................ | 96/35.1 |
| 4,025,348 | 5/1977 | Tsukada et al. ...................... | 430/288 |
| 4,043,819 | 8/1977 | Baumann ............................. | 430/288 |
| 4,247,621 | 1/1981 | Sano et al. ........................... | 430/269 |
| 4,250,248 | 2/1981 | Faust .................................... | 430/284 |
| 4,278,752 | 7/1981 | Gervay et al. ....................... | 430/281 |
| 4,296,196 | 10/1981 | Faust .................................... | 430/271 |
| 4,361,640 | 11/1982 | Pine ..................................... | 430/281 |

*Primary Examiner*—J. Travis Brown
*Attorney, Agent, or Firm*—Schwartz, Jeffery, Schwaab, Mack, Blumenthal & Koch

[57] ABSTRACT

A radiation-polymerizable mixture is described comprising (a) a compound which has at least two terminal ethylenically unsaturated groups and which can form a crosslinked polymer by means of free radical initiated chain addition polymerization, (b) a polymeric binder, (c) a radiation-activatable polymerization initiator which can be activated by radiation, and (d) a compound which is thermally crosslinkable with the polymeric binder (b), with the polymerization product of compound (a) and/or with itself and which, if its crosslinking groups are epoxy groups, has at least three epoxy groups. A photopolymerizable copying material is also disclosed having a flexible transparent temporary support and a transferable thermoplastic photopolymerizable layer comprising the foregoing radiation-polymerizable mixture. The photopolymerizable layer, after photocrosslinking, can be additionally cured by thermal crosslinking and is therefore suitable for the manufacture of solder resists and high performance printing plates.

24 Claims, No Drawings

RADIATION-POLYMERIZABLE MIXTURE AND PHOTOPOLYMERIZABLE COPYING MATERIAL PREPARED THEREFROM

BACKGROUND OF THE INVENTION

The present invention relates to a radiation-polymerizable mixture containing as essential constituents: (a) a compound which has at least two terminal ethylenically unsaturated groups and which can form a crosslinked polymer by means of free radical initiated chain addition polymerization (b) a polymeric binder and (c) a radiation activatable polymerization initiator. The radiation polymerizable mixture of the invention is particularly useful as a dry transfer photoresist material in the production of solder masks.

Single-faced, double-faced, and particularly through-hole printed circuit boards are provided with a solder mask before they are soldered. The application of such masks leaves only the soldering points exposed, whereby tin is saved on soldering. In addition, some of the soldering heat is kept away from the workpiece, during the soldering process, so that heat-sensitive components with which the printed circuit boards have been equipped are not damaged during the soldering. Last but not least, solder masks have the important function of covering all those areas of the circuit diagram which must not come into contact with the solder so as to avoid, for example, the possible formation of conducting bridges between individual conducting paths, which are fatal for a circuit system. To satisfy these quite complex requirements, numerous processes and products in various forms have been used in the past.

It is clear from the foregoing explanation that solder masks must have an image pattern which is oriented according to the prescribed conducting paths. A method widely used in practice is to apply solder masks by screen printing. This method also makes it possible to apply masks which have a relatively high layer thickness, thereby ensuring that the conducting paths are well shielded and embedded. Masks produced by the screen printing process come up against a limit which is inherent in the system, namely, when the distances between conducting paths are reduced, the relatively coarse image structures of the screen print are no longer adequate for microconductor technology.

In recent years solder masks have, therefore, been produced to an increasing extent by photoresist techniques. As in the production of printed circuits, thermoplastic photopolymerizable layers are laminated by means of pressure and heat to the printed circuit board and hardened by imagewise exposure at those places where the printed circuit board is to be covered. The solder mask is obtained by washing away the unexposed parts of the layer. This process makes possible higher image resolutions than the screen printing process.

Suitable materials of this type have been described, for example, in U.S. Pat. No. 4,278,752. They comprise photopolymerizable layers which contain a certain amount of bonded halogen to improve the flame-resistance. Published European Patent Application No. 15,004 describes a similar material which can be developed dry by mechanically separating exposed and unexposed layer areas ("peel-apart process"). Finally, U.S. Pat. No. 4,230,793 describes a light-hardenable material for the same purpose in which the light-sensitive compounds used are referred to as light-sensitive epoxy resins but are not described in more detail.

Photopolymerizable mixtures known and used for producing photoresist masks are transferred dry and with heating onto the printed circuit board to be masked, and they must, therefore, necessarily be thermoplastic. However, for use as solder masks this property is disadvantageous since the masks must withstand temperatures above 200° C. without decomposition and without melting or even softening too much. Although the photopolymer layer is hardened substantially in the exposed places by crosslinking polymerization, and although this light-hardening can be further enhanced in a known way by re-exposure of the developed image stencil, all known photopolymerizable layers still have a basic softening tendency on heating.

To overcome this disadvantage, it has been proposed in U.S. patent application Ser. No. 366,379 (filed Apr. 7, 1982) to add a bis-epoxy compound to the photopolymerizable mixture for producing the solder mask and to post-cure the light-hardened image stencil by heating after developing. For this purpose, the epoxy compound is dissolved in a customary manner in the coating mixture. This process produces very heat-stable solder masks. However, the photopolymerizable mixture has the disadvantage that its shelf life is shorter than that of an otherwise identical mixture which does not contain any epoxy compound.

SUMMARY OF THE INVENTION

Accordingly, it is an object of the present invention to provide an improved radiation-polymerizable mixture suitable for production of solder masks.

It is also an object of the invention to provide a radiation-polymerizable mixture which can be applied in substantial thicknesses to printed circuit boards and developed to give fine image structures.

Another object of the invention is to provide a radiation-polymerizable mixture which can be transferred dry to a printed circuit board.

A further object of the invention is to provide a radiation-polymerizable mixture which can produce layers capable of withstanding temperatures above 200° C. without decomposition, melting or even softening to an excessive degree.

Additionally it is an object of the present invention to provide a radiation-polymerizable mixture which is storage stable and has a good shelf life in the unexposed state.

Yet another object of the invention is to provide an image stencil which can be additionally hardened by heating after development.

A still further object of the present invention is to provide a radiation-polymerizable mixture suitable for production of high performance printing plates or electroplating resists.

These and other objects of the invention are achieved by providing a radiation-polymerizable mixture comprising: (a) a compound which has at least two terminal ethylenically unsaturated groups and which can form a crosslinked polymer by free radical initiated chain addition polymerization; (b) a polymeric binder; (c) a radiation-activatable polymerization initiator, and (d) a compound which is thermally crosslinkable with at least one material selected from the group consisting of the polymeric binder (b), the polymerization product of compound (a), and itself. If the crosslinking groups of compound (d) are epoxy groups, then compound (d) should comprise at least three epoxy groups.

In a further aspect of the invention a photosensitive copying material is provided comprising a flexible, transparent, temporary support and a transferable, thermoplastic, photopolymerizable layer comprising the foregoing radiation-polymerizable mixture.

DETAILED DESCRIPTION OF PREFERRED EMBODIMENTS

According to the invention, a radiation-polymerizable mixture is proposed which contains (a) a compound which has at least two terminal ethylenically unsaturated groups and which can form a crosslinked polymer by means of chain polymerization by addition which is initiated by free radicals, (b) a polymeric binder and (c) a polymerization initiator which can be activated by radiation. The mixture according to the invention contains in addition (d) a compound which is thermally crosslinkable with the polymeric binder (b), with the polymerization product of compound (a) and/or with itself and which, provided its crosslinking groups are epoxy groups, has at least three epoxy groups.

Preferred compounds suitable for use as compounds which are thermally crosslinkable with the binder, the polymerization production of the ethylenically unsaturated compound and/or with themselves contain as crosslinking groups epoxy groups or groups of the formula —CH$_2$—O—R in which R is a hydrogen atom or a lower alkyl, acyl or hydroxyalkyl group and in which the groups —CH$_2$OR are bonded to a nitrogen atom of an open-chain or cyclic carboxamide or to an aromatic carbon atom of a compound capable of condensing with formaldehyde. The organic radicals R generally contain 1 to 4, preferably 1 to 2, carbon atoms.

The crosslinking compounds are usually contained in the mixture in an amount of about 0.5 to 30, preferably 1 to 8 percent by weight, relative to the non-volatile constituents of the mixture.

The crosslinkable compound should advantageously contain at least two crosslinking groups. The epoxy compounds should have at least three epoxy groups. In general, compounds having a relatively large number of crosslinking groups are especially preferred.

To obtain a long shelf life it is advantageous if the epoxy compound is virtually insoluble in the coating solvent, i.e. if it is present in the coating mixture mostly in a dispersed and undissolved state. The heterogeneous distribution in the prepared photopolymerizable layer which is brought about hereby apparently substantially suppresses premature crosslinking reaction. Compounds having less reactive epoxy groups, for example high molecular weight epoxy compounds, may also be soluble in the coating mixture.

Compounds having crosslinking groups —CH$_2$OR may be present either in dissolved and/or in dispersed form. Their reactivity at normal ambient temperature is evidently not sufficient for premature crosslinking in the layer. Of these compounds, those in which R represents hydrogen or methyl are particularly preferred. The derivatives of cyclic carboxamides, for example of melamine, are also preferred.

In principle, it is also possible to use crosslinking compounds which are very reactive and soluble in the coating mixture. In this case, premature reactions can be prevented by encapsulating these compounds in a covering substance which is insoluble in the coating solvent and which melts or softens below the temperature of subsequent heating for post-cure.

Suitable soluble crosslinking compounds include partially or completely etherified polyhydroxymethylmelamines, such as hexamethoxymethylmelamine; compounds corresponding to the formula

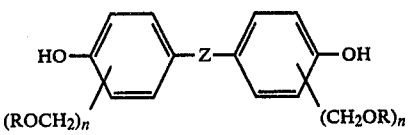

in which Z represents oxygen, sulfur, C$_1$-C$_8$ alkylene for example CH$_2$ and C(CH$_3$)$_2$, or SO$_2$, R denotes a hydrogen atom or a lower alkyl or acyl group and n represents 1 or 2; or homopolymers and copolymers of glycidyl methacrylate.

Examples of suitable crosslinking compounds include:

N-Methylol compounds of organic carboxamides

N,N'-dimethylolurea, N,N'-dimethyloloxamide, N,N'-dimethylolmalonamide, N,N'-dimethylolsuccinimide, N,N'-dimethylolsebacamide, N,N'N''-trimethylolcitramide, 1,3-dimethylolimidazolidine-2-one, 1,3-dimethylol-4,5-dihydroxyimidazidine-2-one, 1,3-dimethylolperhydropyrimidine-2-one, trimethylolmelamine, tetramethylolmelamine, hexamethylolmelamine, 1,3-dimethylol-5-methylperhydro-1,3,5-triazine-2-one, 1,3-dimethylol-5-allylperhydro-1,3,5-triazine-2-one, 1,3-dimethylol-5-butylperhydro-1,3,5-triazine-2-one, 1,2-bis-[1,3-dimethylolperhydro-1,3,5-triazine-2-one-5-yl]ethane, tetramethylolhydrazine dicarboxamide, N,N'-dimethylolterephthalamide, N,N'-dimethylolbenzene-1,3-disulfonamide and tetramethylolglycoluril.

C-Methylol compounds of phenols, phenol-ethers and aromatic hydrocarbons 2,4,6-trimethylolphenol, 2,6-dimethylol-4-methylanisole, 2,6-dimethylol-4-methylphenol, 1,3-dimethylol-4,6-diisopropylbenzene, 2,2-bis-(4-hydroxy-3,5-dimethylolphenyl)propane, and 3,3'-dimethylol-4,4'-dihydroxydiphenyl sulfone.

Instead of the aforementioned methylol compounds, it is also possible to use, for example, the corresponding methyl, ethyl or butyl ethers, or esters of acetic acid or propionic acid. Suitable examples include: 4,4'-bis-methoxymethyldiphenyl ether, tris-methoxymethyldiphenyl ether, tetrakis-methoxymethyl hydrazinedicarboxamide, tetrakis-methoxymethylglycoluril, tetrakis-hydroxyethoxymethylglycoluril, bis-acetoxymethyldiphenyl ether, hexamethoxymethylmelamine.

Examples which may be mentioned of compounds which are insoluble in the coating solution include: triglycidyl isocyanurate, hexamethylolmelamine and dimethylolurea.

Any form of electromagnetic radiation having sufficient energy to trigger polymerization may be used as the actinic radiation to which the mixture of the invention is sensitive. Particularly suitable forms of radiation include visible and ultraviolet light, X-rays, gamma and electron radiation. Laser radiation in the visible and in the ultraviolet region can also be used. Short-wave visible and near ultraviolet light are preferred.

In general, the polymerizable compounds used in the invention are esters of acrylic acid or of methacrylic acid with polyhydric alcohols, preferably primary alcohols. The alcohol should contain 2 to about 4 hydroxyl groups since the desired crosslinking action is achieved by polyunsaturated compounds. The mixture may also contain minor quantities of esters of monohydric alcohols or of alcohols which have more hydroxyl groups. Examples of suitable polyhydric alcohols include: ethylene glycol, propylene glycol, butane-1,4-diol, butane-1,3-diol, diethylene glycol, triethylene glycol, polyethylene glycols or polypropylene glycols having molecular weights from about 200 to 1000, neopentylglycol, trimethylolethane, trimethylolpropane, pentaerythritol and ethoxylated bisphenol A derivatives. Low molecular weight bis-acrylates and bis-methacrylates which contain urethane groups and which are obtained by reacting 2 moles of a hydroxyalkyl acrylate or hydroxyalkyl methacrylate with 1 mole of an aliphatic or cycloaliphatic diisocyanate, for example 2,2,4-trimethylhexamethylene diisocyanate, are also suitable. Monomers of this type containing urethane groups are described in U.S. Pat. No. 4,088,498. Other suitable monomers of this type are described in German Offenlegungsschrift No. 28 22 190 and in German Patent Application No. P 30 48 502.

Mixtures of various monomers are advantageously used. It has proved particularly suitable to combine monomers of the above-mentioned type with higher molecular weight monomers which contain urethane groups and correspond to the general formula:

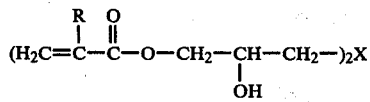

The preparation and use of these compounds has been described in German Patent Application No. P 30 36 694. These polyurethanes generally have reduced specific viscosities (RSV) of about 0.5 to 1.4 dl/g, measured on 1% strength solutions in dimethylformamide at 25° C. Products having RSV values within a range from 0.2 to 0.9 dl/g are preferred. Preferred average values are 8–20 for m, 2–4 for n, 5–12 for o and 2–6 for y.

X' is an alkylene group in which the free valencies are preferably located on one carbon atom. Preferred groups are methylene, 1,1-ethylene and 2,2-propylene groups. R is preferably a methyl group.

The total amount of polymerizable compounds is in general between 20 and 50, preferably 25 to 45 percent by weight relative to the non-volatile components of the mixture. Of this amount 2 to 20, preferably 5 to 10, percent by weight relative to the same basis, can be composed of polyurethanes of the general formula given above.

The mixtures according to the invention also contain a polymeric binder. Preferably the binder is saturated. Water-insoluble binders which are soluble, or at least swellable, in aqueous-alkaline solutions are preferably used. As groups which impart solubility in alkali, the

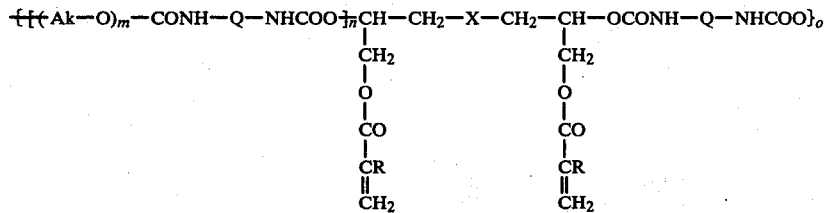

wherein

Q represents a bivalent mononuclear or binuclear aromatic radical which is unsubstituted or substituted by lower alkyl groups and which can contain a lower alkylene group as a connecting member, X represents one of the groups —O—Ph—X'—Ph—O— and —OOC—(CH$_2$)$_y$—COO—, in which Ph is an optionally substituted phenylene group, X' represents an alkylene group having 1–4 carbon atoms and y represents a number from 2 to 12, R represents a hydrogen atom or a methyl group, Ak is an alkylene radical having 2–4 carbon atoms, m is a number from 4 to 50, n is a number from 1 to 6, and o is a number from 4 to 20.

These polyether ester urethanes are prepared in a known manner by reacting oligomeric diisocyanates of the formula

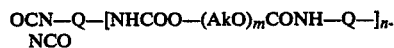

with bis-acrylate diols of the formula binders can contain phosphonic acid groups, sulfonic acid groups, sulfonamide groups, carboxylic anhydride groups and preferably carboxyl groups. Preferred binders are mixed polymers of methacrylic acid and alkyl methacrylates and, optionally, also styrene or other comonomers, as described in German Offenlegungsschriften Nos. 20 64 080 and 23 63 806. The binders are used in an amount of 40 to 80, preferably 50 to 70, percent by weight of the non-volatile constitutents of the mixture.

A large number of substances can be used as photoinitiators in the mixture according to the invention. Examples include benzoin and its derivatives; polynuclear quinones; trichloromethyl-s-triazines; acridine derivatives such as 9-phenylacridine, 9-p-metoxyphenylacridine, 9-acetylaminoacridine or benz(a)acridine; phenazine derivatives such as 9,10-dimethylbenzo(a)phenazine, 9-methylbenzo(a)phenazine or 10-methoxybenzo(a)phenazine; quinoxaline derivative such as 6,4',4"-trimethoxy-2,3-diphenylquinoxaline or 4',4"-dimethoxy-2,3-diphenyl-5-azaquinoxaline; and quinazoline derivatives. The acridine, phenazine and quinoxaline derivatives are preferred. The photoinitiators are in general used in an amount of 0.01 to 10 percent, preferably 0.05 to 2 percent, by weight.

The mixtures preferably contain at least one dyestuff to make the developed resist stencil more visible. For this purpose a combination of at least two dyestuffs may advantageously be used, of which one dyestuff changes its color or irradiation and is destroyed (i.e. becomes colorless) at temperatures above 200° C. The other dyestuff should be able to survive not only irradiation but also temperatures above 200° C. without change. It should make the solder mask clearly visible during soldering and thereafter.

Suitable examples of dyestuffs which change color on exposure include triphenylmethane dyestuffs and certain azo dyestuffs described in U.S. Pat. No. 4,241,166.

Suitable light- and heat-resistant dyestuffs include oxazolone dyestuffs, for example a dyestuff of the formula

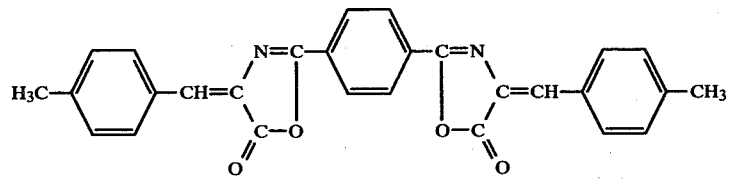

or anthraquinone dyestuffs, for example 1,4-bis-(4-tert.-butoxyphenylamino)-5,8-dihydroxyanthraquinone.

Mixtures according to the invention can also contain, in addition to monomers, binders, photoinitiators and dyestuffs, a series of other customary additives, for example inhibitors for preventing thermopolymerization of the monomers, hydrogen donors, sensitometric regulators, pigments and plasticizers.

The mixture according to the invention is preferably used as a photoresist, in particular as a solder mask. For this purpose, the mixture can be applied in a known manner as a solution or as a prefinished, transferable dry resist film to the workpiece to be processed, for example a printed circuit board. The mixture is preferably processed into a dry resist material. In general a solution of the mixture in a solvent is applied to a suitable support such as a polyester film and dried. The thickness of the resist layer can be about 10 to 150 μm, preferably 20 to 120 μm. The free surface of the layer is preferably covered with a covering film, for example a film of polyethylene or polypropylene. The finished laminate can be stored in the form of a full width roll which can be cut as needed into resist rolls of any desired width.

Even after months of storage at 20° C., the resist rolls remain unchanged and can be processed without problems, and the cut edges remain completely free of resist outflows which lead to sticking. Resist layers stored for more than two months at 40° C. in a drying cabinet show no differences, compared to freshly prepared layers, with regard to suitability for lamination, developability and soldering resistance.

The films can be processed with the equipment customarily used to handle dry resists. In a commercially available laminating device the covering film is peeled off and the solder resist layer is laminated onto the printed circuit board which is to be protected and which has been provided, for example, with metallized bores. The resulting board is then exposed through an original which protects from irradiation those parts of the board which must be left free for the soldering process.

The resist films, freed from the support film, are developed in a known manner. Suitable developers include aqueous, preferably aqueous-alkaline, solutions, for example of alkali metal phosphates, alkali metal carbonates or alkali metal silicates, to which small amounts, for example up to 10 percent by weight, of wetting agents or organic solvents which are miscible with water can be added, if desired.

Fully prepared printed circuit boards, covered by the process steps just described, must then be subjected to a heat treatment before the soldering process. It is believed that in this treatment a crosslinked network is formed which is responsible for the good mechanical, thermal and chemical properties of the solder masks. This thermal treatment is generally carried out between 80° C. and 150° C. for approximate treatment times of 10 to 60 minutes.

The board which is ready for soldering can be equipped with electronic components, the connectors of which are bent across the appropriate lines of the circuit in the areas which are exposed in the developing process. The conducting side of the board can then be treated with a suitable, commercially available soldering flux and subjected to flow soldering in a commercially available flow soldering machine. The soldering metals used are known eutectic mixtures which permit soldering temperatures of about 230° to 260° C. A known mixture contains, for example, 63 percent by weight of tin and 37 percent by weight of lead.

Solder masks according to the invention can also be used successfully in processes in which double-faced, through-hole printed circuit boards are soldered by dipping into liquid metal baths.

The mixtures according to the invention produce solder resist layers which are distinguished by a high flexibility and mechanical strength in the unexposed and exposed states and by a high heat resistance in the exposed and post-cured state. In combination with the preferred photoinitiators, the photopolymerizable layers have a high sensitivity to light, and satisfactory curing or crosslinking throughout the layer is obtained even in thick layers. Even with thicknesses above 100 μm, the exposed layers can be developed perfectly and completely by means of aqueous-alkaline solutions.

The exposed and developed layers can be thermally cured without excessively impairing the flexibility of the mask or its adhesion to the substrate and without altering the position and dimensions of the areas exposed by developing. The cured masks are resistant to atmospheric, thermal and chemical influences for relatively long time periods. Solder masks produced from the mixtures according to the invention are particularly suitable for protecting sensitive electronic conductor structures from atmospheric attack in an effective and permanent manner.

Although the invention has been described above in conjunction with its preferred use for manufacturing solder masks, it is not restricted to this use. It is useful in any situation where it is desired to produce imagewise stencils having high thermal, mechanical and chemical resistance. This is the case also in other photoresist applications, for example, in the production of electroplating resists, which are intended to be resistant to aggressive baths and/or at elevated temperatures. The mixture according to the invention is particularly suitable also for the manufacture of offset printing plates, for example on aluminum, steel or chromium support materials, which, after developing, are intended to be baked in a known manner to consolidate the image stencil. This process is described in British Pat. No. 1,154,749. However, in this mode of application, heating should be carried out for a shorter time and at higher temperatures, in general for 2 to 20 minutes at temperatures within a range of 200° to 250° C. This can considerably increase also the print run of photopolymerizable offset printing plates.

The following examples illustrate particular embodiments of the mixture of the invention. Unless otherwise indicated, percentages and quantity ratios are expressed in terms of weight units. The quantities in the formulations are given in parts by weight.

EXAMPLE 1

The following crosslinking agents:
(a) 0.6 part 2,2-bis-(4-glycidoxyphenyl)-propane (0.00316 mole of epoxy groups=7 mole %, relative to COOH groups in the binder),
(b) 0.21 part hexamethoxymethylmelamine (0.00316 mole of methoxymethyl groups=7 mole % relative to COOH groups in the binder),
(c) 0.21 part condensed-on hexamethoxymelamine (approx. 0.003 mole of methoxymethyl groups=approx. 7 mole %, relative to COOH groups in the binder),
(d) 0.28 part tetramethylol-bisphenol-A (0.00316 mole of hydroxymethyl groups=7 mole % relative to COOH groups in the binder),
(e) 0.16 part hexamethylolmelamine (0.00316 mole of hydroxymethyl groups=7 mole % relative to COOH groups in the binder),
(f) 0.31 part triglycidyl isocyanurate (0.00316 mole of epoxy groups=7 mole % relative to COOH groups in the binder),
(g) 1.2 parts 2,2-bis-(4-glycidoxyphenyl)-propane (0.00632 mole of epoxy groups=14 mole % relative to COOH groups in the binder),
(h) 0.41 part hexamethoxymethylmelamine (0.00632 mole of methoxymethyl groups=14 mole % relative to COOH groups in the binder),
(i) 0.41 part condensed-on hexamethoxymethylmelamine (approx. 0.006 mole of methoxymethyl groups-=approx. 14 mole % relative to COOH groups in the binder),
(k) 0.55 part tetramethylol-bisphenol-A (0.00632 mole of hydroxymethyl groups=14 mole % relative to COOH groups in the binder),
(l) 0.32 part hexamethylolmelamine (0.00632 mole of hydroxymethyl groups=14 mole % relative to COOH groups in the binder),
(m) 0.19 part dimethylolurea (0.00316 mole of hydroxymethyl groups=7 mole % relative to COOH groups in the binder), and
(n) 0.41 part bis-methoxymethyldiphenyl ether (0.00316 mole of methoxymethyl groups=7 mole % relative to COOH groups in the binder),
were added in the amounts indicated to individual solutions of 13 parts terpolymer of n-hexyl methacrylate, methacrylic acid and styrene (60:30:10) having an average molecular weight of about 35,000 and an acid number of 195,
6.4 parts polyethylene glycol 400 dimethacrylate,
1.6 parts of the elastomer described below,
0.2 part 9-phenylacridine,
0.01 part blue dyestuff obtained by coupling the diazonium salt of 2,4-dinitro-6-chlorobenzene with 2-methoxy-5-acetylamino-N,N-diethylaniline and
0.03 part 1,4-bis-(4-tert.butoxyphenylamino)-5,8-dihydroxyanthraquinone in
30.0 parts of butanone and
5.0 parts of ethanol.

The elastomer used was prepared as follows:
A. In a 1 liter four-necked flask, equipped with a stirrer, a thermometer, a reflux condenser and a drying tube, 426 parts glycidyl methacrylate and 216 parts adipic acid were mixed by stirring and the mixture was heated carefully to an internal temperature of 80° C. after the addition of 19.7 parts p-methoxyphenol and 6.4 parts benzyltriethylammonium chloride. After about 2 hours a clear solution was obtained which was kept at 80° C. for a further 14 hours. After this time, the content of the free glycidyl methacrylate was less than 0.5%.

B. 143 parts oligomeric diisocyanate of the formula

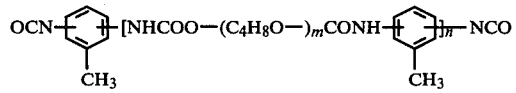

having an average molecular weight of about 2,000 and an isocyanate group content of 4.1 percent by weight (Adiprene L 100), dissolved in 300 parts by volume of methylethylketone, were placed into a 1 liter four-necked flask equipped with a stirrer, thermometer, dropping funnel, condenser and drying tube, and 0.87 part benzoquinone and 0.85 part by volume of a solution were added which had been prepared by dissolving 6.3 parts iron (III) acetylacetonate and 0.45 part triethylamine in methylethylketone and adding methylethylketone to 100 parts by volume. A solution of 31.33 parts of the reaction product obtained in accordance with A. in 300 parts by volume of methylethylketone was poured into the dropping funnel and added dropwise over the course of 40 minutes to the solution in the flask which was heated at 70° C. and stirred. After two hours further stirring at 30° C., 10 parts by volume of ethanol were added to the clear reaction mixture. Distilling off the solvent from the viscous solution produced a nontacky, rubber-like mass which gave clear solutions in numerous organic solvent, such as tetrahydrofuran, acetone or toluene. The reduced specific viscosity of the product was 0.72 dl/g (measured with a 1 percent strength solution in dimethylformamide at 25° C.).

The described solutions were coated in a continuous manner by means of a slot die onto 110 cm wide webs of a biaxially oriented and heat-set 25 $\mu$m thick polyethylene terephthalate film. After passing through a drying zone, the resist layers each had a thickness of 100 $\mu$m and were covered with a polypropylene film. The resulting dry resist films were then cut, by means of a roll cutter, into manageably sized resist rolls having a width of 45 cm and a web length of 50 m.

Test boards of rigid epoxy glass fabric having approximately 65 $\mu$m thick conducting paths with a tinned surface and through-plated holes were used in the laminating experiments. The widths of the conducting paths and distances between the paths were between 200 and 1,000 μm, and the hole diameteres were 0.6 to 4 mm. The 100 μm thick solder resist layers were laminated at 120° C. by means of a commercially available laminating device onto these boards.

The boards were then exposed, through an exposure original which covered the areas and holes to be soldered, for 10 seconds using a commercially available exposure device having a 5 kW metal halide lamp, developed in a commercially available spray processor for 100 seconds with a 0.8 percent strength sodium carbonate solution and blown dry. The resulting printed circuit boards were then cured for 60 minutes at 150° C. in a drying cabinet. The cooled boards were then wetted with the soldering flux TL 33-16 from Messrs. Alpha Grillo and then passed at a speed of 0.5 m/min through a commercially available flow soldering bath at 250° C.

This process produced boards having a dust-dry, very impact-resistant and scratch-proof surface. Even narrow conducting paths were tightly shielded by the cured solder resist layer.

To determine the shelf life, samples of the dry resist materials described above were stored at 40° C. in a drying cabinet. Each day one sample was removed and laminated, exposed and developed, all three steps being carried out as described above. The shelf life of various resist layers is indicated in the following table by the number of days after which the layer could still be completely developed:

erties of the resists caused thereby are briefly noted in the Table. Thirteen parts by weight of the terpolymer specified in Example 1 were used as the binder in all six examples. Moreover, the polyurethane monomer specified in Example 1 as well as the photoinitiator and dyestuffs were added in the same amounts as used in Example 1. The thixotropic urethane monomers additionally used in Examples 4 and 5 prevent edge outflow of the unexposed resist layer.

| Example | Low molecular weight monomer (PEG 400 DMA*) parts by weight | Low molecular weight additional monomer, parts by weight | Condensed-on hexamethoxy-methyl-melamine parts by weight | Comments | Shelf life days at 40° C. |
|---|---|---|---|---|---|
| 2 | — | PPG 420 DMA** 6.4 | 0.21 | Slightly more brittle layer than with PEG 400 DMA | >76 |
| 3 | 4.8 | PPG 420 DMA** 1.6 | 0.21 | High light sensitivity, no edge outflow, long shelf life | >76 |
| 4 | 4.8 | Oligourethane 1*** 1.6 | 0.21 | No edge outflow | >76 |
| 5 | 4.8 | Oligourethane 2**** 1.6 | 0.21 | | >76 |
| 6 | 5.2 | | 0.8 | High crosslinking rate | >168 |
| 7 | 4.8 | | 1.6 | Long shelf life | >66 |

*Polyethylene glycol 400 dimethacrylate
**Polypropylene glycol 420 dimethacrylate
***Oligourethane of PEG 300, hexamethylene diisocyanate and glycerol dimethacrylate
****Oligourethane of PEG 400, hexamethylene diisocyanate and glycerol dimethacrylate

EXAMPLE 8

The following amounts of low molecular weight monomers and crosslinking agents,
(a) 6.4 parts PEG 400 DMA and
0.2 part hexamethoxymethylmelamine,
(b) 5.2 parts PEG 400 DMA and
0.2 part hexamethoxymethylmelamine
(c) 5.2 parts PEG 400 DMA and
0.8 part hexamethoxymethylmelamine and
(d) 6.4 parts PEG 400 DMA and
0.24 part triglycidyl isocyanurate, were each added to individual solutions of
13 parts terpolymer specified in Example 1,
1.6 parts elastomer of Example 1,
0.2 part 9-phenylacridine,
0.03 part 1,4-bis-(4-tert.butoxyphenylamino)-5,8-dihydroxyanthraquinone and
0.01 part blue dyestuff specified in Example 1 in
30 parts butanone and
5 parts ethanol.

| Layer | a | b | c | d | e | f | g | h | i | k | l | m |
|---|---|---|---|---|---|---|---|---|---|---|---|---|
| Shelf life (days at 40° C.) | 10 | >80 | >67 | >77 | >70 | 39 | 5 | >72 | >61 | >70 | >70 | >61 |

It should be noted that a baking time of 60 minutes is not absolutely necessary. Adequate soldering resistance is shown, for example, by layers b and c after only 30 minutes baking and by layer f after only 15 minutes baking. The baking time can also be shortened by using a longer exposure time.

EXAMPLES 2-7

In the following Table, six examples are summarized which followed the same procedure described in Example 1 but had different formulations. Variations in prop- Resist rolls having a width of 45 cm and a web length of 50 m were prepared as described in Example 1 using the solutions having the indicated compositions.

The resulting dry resist films were laminated at 120° C. with a commercially available laminating device onto laminated phenoplast boards covered with a 35 μm thick copper foil and in each case exposed for 10 seconds by means of a 5 kW metal halide light. The original used was a line original with line widths and distances down to 80 μm.

After exposure, the polyester film was peeled off, and the layers were developed for 180 seconds with 0.8 percent strength sodium carbonate solution in a spray developing device. The boards were then rinsed for 30 seconds with tap water, etched for 30 seconds in a 15 percent ammonium peroxodisulfate solution, rinsed again with water, dipped for 30 seconds in 10 percent sulfuric acid and then electroplated in the following electrolyte baths:

(1) 120 minutes in a copper electrolyte bath from Messrs. Schloetter, Geislingen/Steige, "bright copper bath" type
  Current density: 2.5 A/dm$^2$
  Metal build-up: about 100 μm
  Temperature: room temperature
(2) 2 minutes in a nickel bath of the "Norma" type from Messrs. Schloetter, Geislingen/Steige
  Current density: 4 A/dm$^2$
  Metal build-up: 2 μm
  Temperature: 50° C.

The boards did not exhibit any penetration underneath the coating or any damage. It was then possible to strip the boards in 5 percent KOH solution at 50° C., and to remove the exposed copper in customary etching media.

EXAMPLE 9

The following coating solutions were spincoated onto electrochemically roughened and anodized aluminum which had an oxide layer of 2 g/m$^2$ and which had been pretreated with an aqueous solution of polyvinylphosphonic acid:

(a) 2 parts copolymer of styrene and monobutyl maleate (1:1, molecular weight about 68,000),
2 parts diurethane formed from 2 moles of glycerol dimethacrylate and 1 mole of hexamethylene diisocyanate,
0.7 part 9-phenylacridine and
0.07 part blue dyestuff obtained by coupling the diazonium salt of 2,4-dinitro-6-chlorobenzene with 2-methoxy-5-acetylamino-N-cyanoethyl-N-hydroxyethylaniline in
24 parts butanone,
10 parts butyl acetate and
10 parts ethylene glycol monomethyl ether.

(b) a coating solution as described under (a) which additionally contained 0.027 part partially condensed-on hexamethoxymethylmelamine.

The plates were then dried for 2 minutes at 100° C. in a circulating air drying cabinet. A layer weight of 2.5 g/m$^2$ was obtained.

The resulting printing plates were then exposed for 40 seconds through a 13-step exposure wedge having density increments of 0.15 by means of a 5 kW metal halide light at a distance of 110 cm between the light and the vacuum copying frame. The plates were then developed manually with a developer having the following composition:
3.0 parts sodium metasilicate×9 H$_2$O,
0.03 part non-ionic wetting agent (coconut fatty alcohol polyoxyethylene ether containing about 8 oxyethylene units),
0.003 part antifoam agent,
0.02 part nitrilotriacetic acid,
0.053 part strontium chloride×6 H$_2$O and
96.894 parts fully demineralized water.

Seven to eight fully crosslinked wedge steps were obtained. The plate coated with solution b was baked for 10 minutes at 230° C. after developing and gave a considerably increased print run.

The foregoing description has been set forth merely to illustrate the invention and is not intended to be limiting. Since modifications of the described embodiments incorporating the spirit and substance of the invention may occur to persons skilled in the art, the scope of the invention is to be limited solely with respect to the appended claims and equivalents.

We claim:

1. A radiation-polymerizable mixture consisting essentially of (a) a compound which has at least two terminal ethylenically unsaturated groups and which can form a crosslinked polymer by free radical initiated chain addition polymerization (b) a polymeric binder which is insoluble in water and at least swellable in aqueous alkaline solutions, (c) a radiation-activatable polymerization initiator, and (d) a compound which is thermally crosslinkable with a material selected from the group consisting of the polymeric binder (b), the polymerization product of compound (a), and itself, and which, if the crosslinking groups of said compound (d) are epoxy groups, has at least three epoxy groups.

2. A radiation-polymerizable mixture according to claim 1, wherein said crosslinkable compound (d) comprises from 0.5 to 30 percent by weight of the non-volatile constituents of the mixture.

3. A radiation-polymerizable mixture according to claim 2, wherein said crosslinkable compound (d) comprises from 1 to 8 percent by weight of the non-volatile constituents of the mixture.

4. A radiation-polymerizable mixture according to claim 1, wherein said crosslinkable compound contains crosslinking groups selected from the group consisting of epoxy groups and groups corresponding to the formula

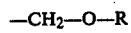

in which R represents a hydrogen atom or a lower alkyl, acyl or hydroxyalkyl group and the groups —CH$_2$OR are bonded to a nitrogen atom of an open-chain or cyclic carboxamide or to an aromatic carbon atom of a compound capable of condensing with formaldehyde.

5. A radiation-polymerizable mixture according to claim 4, wherein said crosslinkable compound is an N-methylol compound selected from the group consisting of N,N'-dimethylolurea, N,N'-dimethyloloxamide, N,N'-dimethylolmalonamide, N,N'-dimethylolsuccinamide, N,N'-dimethylolsebacamide, N,N',N''-trimethylolcitramide, 1,3-dimethylolimidazolidine-2-one, 1,3-dimethylol-4,5-dihydroxyimidazolidine-2-one, 1,3-dimethylolperhydropyrimidine-2-one, trimethylolmelamine, tetramethylolmelamine, hexamethylolmelamine, 1,3-dimethylol-5-methylperhydro-1,3,5-triazine-2-one, 1,3-dimethylol-5-allylperhydro-1,3,5-triazine-2-one, 1,3-dimethylol-5-butylperhydro-1,3,5-triazine-2-one, 1,2-bis-[1,3-dimethylolperhydro-1,3,5-triazine-2-one-5-yl]ethane, tetramethylolhydrazine dicarboxamide, N,N'-dimethylolterephthalamide, N,N'-dimethylolbenzene-1,3-disulfonamide and tetramethylolglycoluril.

6. A radiation-polymerizable mixture according to claim 4, wherein said crosslinkable compound is a C- methylol compound selected from the group consisting of 2,4,6-trimethylolphenol, 2,6-dimethylol-4-methylanisole, 2,6-dimethylol-4-methylphenol, 1,3-dimethylol-4,6-diisopropylbenzene, 2,2-bis-(4-hydroxy-3,5-dimethylolphenyl)propane, and 3,3'-dimethylol-4,4'-dihydroxydiphenyl sulfone.

7. A radiation-polymerizable mixture according to claim 4, wherein said crosslinkable compound is selected from the group consisting of 4,4'-bis-methoxymethyldiphenyl ether, tris-methoxymethyldiphenyl ether, tetrakis-methoxymethyl hydrazinedicarboxamide, tetrakis-methoxymethylglycoluril, tetrakis-hydroxyethoxymethylglycoluril, bis-acetoxymethyldiphenyl ether, and hexamethoxymethylmelamine.

8. A radiation-polymerizable mixture according to claim 1, wherein said crosslinkable compound contains at least two crosslinking groups.

9. A radiation-polymerizable mixture according to claim 1, wherein said crosslinkable compound is an epoxy compound which is insoluble in coating solvents used for said mixture.

10. A radiation-polymerizable mixture according to claim 1, wherein the unsaturated groups of said polymerizable compound are selected from the class consisting of acrylate groups and methacrylate groups.

11. A radiation-polymerizable mixture according to claim 10, wherein said polymerizable compound is an ester of an acid selected from the group consisting of acrylic acid and methacrylic acid with a polyhydric alcohol containing from 2 to about 4 hydroxyl groups.

12. A radiation-polymerizable mixture according to claim 11, wherein said polyhydric alcohol is selected from the group consisting of ethylene glycol, propylene glycol, butane-1,4-diol, butane-1,3-diol, diethylene glycol, triethylene glycol, polyethylene glycols or polypropylene glycols having molecular weights from about 200 to 1000, neopentylglycol, trimethylolethane, trimethylolpropane, pentaerythritol and ethoxylated bisphenol A derivatives.

13. A radiation-polymerizable mixture according to claim 10, wherein said polymerizable compound is a urethane group-containing reaction product of two moles of a hydroxyalkyl acrylate or hydroxyalkyl methacrylate with one mole of an aliphatic or cycloaliphatic diisocyanate.

14. A radiation-polymerizable mixture according to claim 10, wherein said polymerizable compound comprises an admixture comprising from 2 to 20 percent by weight of a urethane group-containing prepolymer corresponding to the formula:

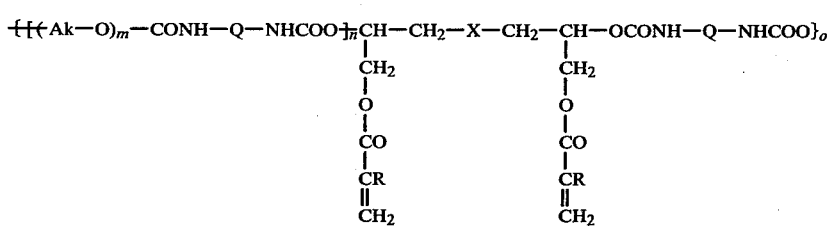

wherein
Q represents a bivalent mononuclear or binuclear aromatic radical which is unsubstituted or substituted by lower alkyl groups and which can contain a lower alkylene group as a connecting member,
X represents one of the groups —O—Ph—X'—Ph—O— and —OOC—(CH$_2$)$_y$—COO—, wherein Ph is an optionally substituted phenylene group, X' represents an alkylene group having 1–4 carbon atoms and y represents a number from 2 to 12,
R represents a hydrogen atom or a methyl group,
Ak is an alkylene radical having 2–4 carbon atoms,
m is a number from 4 to 50,
n is a number from 1 to 6 and
o is a number from 4 to 20.

15. A radiation-polymerizable mixture according to claim 1, wherein said polymeric binder is soluble in aqueous alkaline solutions.

16. A radiation-polymerizable mixture according to claim 15, wherein said polymeric binder is a water-insoluble saturated polymer containing an effective alkali-solubility-imparting number of functional groups selected from the class consisting of phosphonic acid groups, sulfonic acid groups, sulfonamide groups, carboxylic anhydride groups and carboxyl groups.

17. A radiation-polymerizable mixture according to claim 1, wherein said polymerizable compound comprises from 20 to 50 percent, said polymeric binder comprises from 40 to 80 percent, said polymerization initiator comprises from 0.01 to 10 percent and said crosslinkable compound comprises from 0.5 to 30 percent of the weight of the non-volatile constituents of the mixture.

18. A radiation-polymerizable mixture according to claim 17, wherein said polymerizable compound comprises from 25 to 45 percent, said polymeric binder comprises from 50 to 70 percent, said polymerization initiator comprises from 0.05 to 2 percent and said crosslinkable compound comprises from 1 to 8 percent of the weight of the non-volatile constituents of the mixture.

19. A radiation-polymerizable mixture according to claim 1 further comprising at least one dyestuff for making said mixture more visible.

20. A radiation-polymerizable mixture according to claim 19, wherein said mixture comprises at least one dyestuff which changes its color on irradiation and is destroyed at temperatures above 200° C. and at least one dyestuff which is stable under conditions of irradiation and at temperatures above 200° C.

21. A photopolymerizable copying material comprising a flexible, transparent, temporary support and a transferably thermoplastic photopolymerizable layer consisting essentially of (a) a compound which has at least two terminal ethylenically unsaturated groups and which can form a crosslinked polymer by free radical initiated chain addition polymerization, (b) a polymeric binder which is insoluble in water and at least swellable in aqueous alkaline solutions, (c) a radiation-activatable polymerization initiator, and (d) a compound which is thermally crosslinkable with a material selected from the group consisting of the polymeric binder (b), the polymerization product of the compound (a), and itself and which, if the crosslinking groups of said compound (d) are epoxy groups, has at least three epoxy groups.

22. A copying material according to claim 21, wherein said photopolymerizable layer has a thickness in the range from 10 to 150 µm.

23. A copying material according to claim 21 further comprising a covering material selected from the group consisting of polyethylene films and polypropylene films disposed over the free surface of said photopolymerizable layer.

24. A radiation-polymerizable mixture according to claim 1, wherein said polymeric binder is a mixed polymer comprising methacrylic acid and alkyl methacrylates.

* * * * *